United States Patent [19]

Abolins et al.

[11] 4,404,125

[45] Sep. 13, 1983

[54] POLYPHENYLENE ETHER RESIN COMPOSITIONS FOR EMI ELECTROMAGNETIC INTERFERENCE SHIELDING

[75] Inventors: Visvaldis Abolins, Delmar; Richard C. Bopp, Ballston Lake; Joel M. Caraher, Pattersonville; Eric M. Lovgren, Westerlo, all of N.Y.

[73] Assignee: General Electric Company, Pittsfield, Mass.

[21] Appl. No.: 311,268

[22] Filed: Oct. 14, 1981

[51] Int. Cl.$^3$ ............................................... H01B 1/06
[52] U.S. Cl. .................................... 252/511; 252/512; 525/132; 524/441; 524/495; 524/496; 524/508
[58] Field of Search .................... 252/511, 512, 508; 524/441, 495, 496, 508; 525/132, 905; 528/485, 490; 200/304, 305; 335/301

[56] References Cited

U.S. PATENT DOCUMENTS

| | | | |
|---|---|---|---|
| 3,257,357 | 6/1966 | Stamatoff | 260/47 |
| 3,257,358 | 6/1966 | Stamatoff | 260/47 |
| 3,306,874 | 2/1967 | Hay | 260/47 |
| 3,306,875 | 2/1967 | Hay | 260/47 |
| 3,383,435 | 5/1968 | Cizek | 525/132 |
| 4,158,028 | 6/1979 | Izawa et al. | 525/132 |
| 4,203,931 | 5/1980 | Lee | 525/132 |
| 4,233,195 | 11/1980 | Mills | 525/441 |
| 4,282,139 | 8/1981 | Sugio et al. | 525/132 |
| 4,292,087 | 9/1981 | Bell | 106/171 |
| 4,293,478 | 10/1981 | Sugio et al. | 525/132 |
| 4,305,847 | 12/1981 | Stoetzer et al. | 252/511 |

*Primary Examiner*—Josephine Barr
*Attorney, Agent, or Firm*—Hedman, Casella, Gibson, Costigan & Hoare

[57] ABSTRACT

Compositions or composites comprising a polyphenylene ether-styrene resin blend or composition are disclosed which have electromagnetic shielding properties so that when the compositions are used for electronic equipment components or housings they provide shielding against electromagnetic interference referred to as EMI. The composites eliminate the secondary treatments which have been used heretofore to provide these shielding properties, such as the application of electrically conductive silver, nickel, copper and graphite coatings, or the use of metal screens. The novel compositions of a polyphenylene ether-styrene blend contain as a conductive material, which attenuates the EMI, aluminum flakes, or a combination of aluminum flakes with carbon fibers or with a highly conductive carbon black or a combination of carbon fibers with conductive carbon black, or carbon fibers per se.

20 Claims, No Drawings

POLYPHENYLENE ETHER RESIN COMPOSITIONS FOR EMI ELECTROMAGNETIC INTERFERENCE SHIELDING

STATEMENT OF THE INVENTION

This invention relates to compositions or composites comprising a polyphenylene ether-styrene resin blend or composition, which possess electromagnetic shielding properties. The composites contain electrically conductive materials such as aluminum flakes, or a combination of aluminum flakes with carbon fibers or with a highly conductive carbon black, or a combination of carbon fibers with carbon black, or carbon fibers, or carbon black per se, in an amount sufficient to impart electromagnetic interference shielding properties to the polyphenylene ether-styrene resin blends or compositions. The composites can be readily fabricated, as by molding, into electronic equipment components which are shielded against electromagnetic interference (EMI) or radio frequency interference (RFI). The novel compositions or composites eliminate the secondary treatments which have been heretofore required to provide these shielding properties, such as the application of electrically conductive silver, nickel, copper and graphite coatings. The novel compositions of this invention advantageously retain the engineering properties of the polyphenylene ether-styrene resin blends when processed. The invention also includes electronic equipment components and housings fabricated or manufactured from the molded EMI shielding polyphenylene ether-styrene resin composites which have incorporated therein the aforesaid electrically conductive materials.

BACKGROUND OF THE INVENTION

One of the disadvantages of plastic materials is their transparency to electromagnetic radiation. The plastic enclosures permit the electromagnetic (EM) radiation to escape from their source and cause EM pollution and interference with other electric or electronic equipment. The problem of electromagnetic interference is referred to as EMI. Also the plastic enclosures or housings do not protect sensitive and critical electric/electronic equipment such as computers, navigation instruments, medical equipment, radio and television receivers, cardiac pacemakers, audio and high fidelity equipment, etc. from EMI coming from the outside.

Heretofore, to prevent EMI, the surface of the plastic material has been coated with a conductive material, to provide shielding properties, such as by the application of electrically conductive silver, nickel, copper and graphite coatings, or the use of a metal or screen. Such secondary processes shield the sensitive equipment from outside EMI and also contains the EMI generated inside the enclosure and thus prevent the pollution to the surroundings. While these shielding processes are useful, they are time-consuming; they require extra labor and are costly; and they do not lend to automation in the processing cycle. They also present adhesion problems of the coatings.

It has now been found that the above-mentioned secondary processes, and the disadvantages which attend them, can be eliminated by incorporating into polyphenylene ether-styrene resin blends such conductive materials as aluminum flakes, combinations of aluminum flakes with carbon fibers or conductive carbon black, or a combination of carbon fibers with conductive carbon black or carbon fibers. The resulting composites when molded have been found to be highly useful for EMI shielding while at the same time maintaining the physical properties of the polyphenylene ether-styrene resin blends or compositions.

The polyphenylene ether resins are a family of engineering thermoplastics that are well known to the polymer art. These polymers may be made by a variety of catalytic and non-catalytic processes from the corresponding phenols or reactive derivatives thereof. By way of illustration, certain of the polyphenylene ethers are disclosed in Hay, U.S. Pat. Nos. 3,306,874 and 3,306,875, and in Stamatoff, U.S. Pat. Nos. 3,257,357 and 3,257,358. In the Hay patents, the polyphenylene ethers are prepared by an oxidative coupling reaction comprising passing an oxygen-containing gas through a reaction solution of a phenol and a metal-amine complex catalyst. Other disclosures relating to processes for preparing polyphenylene ether resins, including graft copolymers of polyphenylene ethers with styrene type compounds, are found in Fox, U.S. Pat. No. 3,356,761; Sumitomo, U.K. Pat. No. 1,291,609; Bussink et al, U.S. Pat. No. 3,337,499; Blanchard et al, U.S. Pat. No. 3,219,626; Laakso et al, U.S. Pat. No. 3,342,892; Borman, U.S. Pat. No. 3,344,116; Hori et al, U.S. Pat. No. 3,384,619; Faurote et al, U.S. Pat. No. 3,440,217; and Cooper et al, U.S. Pat. No. 3,661,848 U.S. Pat. No. 3,733,299, U.S. Pat. No. 3,838,102 and U.S. Pat. No. 3,988,297. Disclosures relating to metal based catalysts which do not include amines, are known from patents such as Wieden et al, U.S. Pat. No. 3,442,885 (copper-amidines); Nakashio et al U.S. Pat. No. 3,573,257 (metal-alcoholate or -phenolate); Kobayashi et al, U.S. Pat. No. 3,445,880 (cobalt chelates); and the like. In the Stamatoff patents, the polyphenylene ethers are produced by reacting the corresponding phenolate ion with an initiator, such as peroxy acid salt, an acid peroxide, a hypohalite, and the like, in the presence of a complexing agent. Disclosures relating to non-catalytic processes, such as oxidation with lead dioxide, silver oxide, etc., are described in Price et al, U.S. Pat. No. 3,382,212. Cizek, U.S. Pat. No. 3,383,435 discloses polyphenylene ether-styrene resin compositions. All of the above mentioned disclosures are incorporated herein by reference.

It is the primary objective of this invention to provide novel thermoplastic molding compositions of polyphenylene ether-styrene resin compositions which have incorporated an amount of a conductive material, namely, aluminum flakes, or aluminum flakes in combination with carbon fiber or with conductive carbon black, or with a combination of carbon fibers and carbon black, or carbon fibers so as to render the resin EMI shielding.

DETAILED DESCRIPTION OF THE INVENTION

The EMI shielding compositions of the invention comprise essentially:

(a) a polyphenylene ether-styrene resin composition; and (b) a conductive material, such as aluminum flakes, combinations of aluminum flakes and carbon fibers or conductive carbon black, or combinations of carbon fibers and conductive carbon black, or carbon fibers, or carbon black in amount sufficient to render the composition when molded EMI shielding.

The polyphenylene ether resins comprise homo- and copolymers of structural units of the formula:

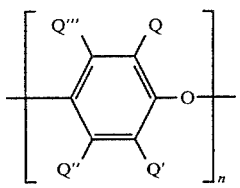

wherein Q, Q', Q'' and Q''' are independently selected from the group consisting of hydrogen, hydrocarbon radicals, halohydrocarbon radicals having at least two carbon atoms between the halogen atom and the phenyl nucleus, hydrocarbonoxy radicals and halohydrocarbonoxy having at least two carbon atoms between the halogen atom and the phenyl nucleus, and Q', Q'' and Q''' in addition may be halogen with the proviso that Q and Q' are both free of a tertiary carbon atom; and n represents the total number of monomer residues and is an integer of at least 50.

The preferred polyphenylene ether resin is a poly(2,6-dimethyl-1,4-phenylene)ether resin (hereinafter, PPO) having an intrinsic viscosity of from about 0.30 dl/g to about 0.60 dl/g in chloroform.

The styrene resin is preferably a homopolymer derived from styrene such as polystyrene or may be a rubber modified polystyrene, such as a butadiene rubber modified polystyrene, also referred to as a high impact polystyrene or HIPS; or styrene-butadiene-styrene block copolymer such as the Kraton or Kraton-G polymers that are described in U.S. Pat. Nos. 3,646,162 and U.S. Pat. No. 3,595,942, respectively, or any of the "styrene resins" disclosed in the Cizek U.S. Pat. No. 3,383,435 referred to above.

The amount of polyphenylene ether and styrene resin in the blend may vary over a wide range since the two resins are compatible in all proportions. Preferably, for every 100 parts of the two resins together from about 20 to about 80 parts by weight of the polyphenylene ether is employed to from about 80 to about 20 parts by weight of the styrene resin.

The amount of the electrically conductive material employed is that sufficient to impact EMI shielding properties to the composite. In the case of the aluminum flakes it may range from about 25 parts to about 250 parts by weight for every 100 parts by weight of the polyphenylene ether-styrene resin composition. In the case where a combination of aluminum flakes and carbon fiber is employed, the range is from about 0 parts by weight to about 250 parts by weight of the aluminum flakes to about 0 parts to about 100 parts by weight of the carbon fibers; and for every 100 parts by weight of the polyphenylene ether-styrene resin composition from about 25 parts to about 250 parts by weight of the aluminum flakes carbon fiber composition are employed.

In the case where a combination of aluminum flakes and conductive carbon black is employed, the range is from about 0 parts to about 250 parts by weight of the aluminum flakes to about 0 parts to about 25 parts by weight of the carbon black; and for every 100 parts by weight of the polyphenylene ether-styrene resin composition from about 10 parts to about 250 parts by weight of the aluminum flakes-carbon black composition is employed.

In the case where a combination of carbon fibers and carbon black is employed, the range is from about 0 parts to about 100 parts by weight of the carbon fibers to about 0 parts to about 25 parts by weight of the carbon black; and for every 100 parts by weight of the polyphenylene ether-styrene resin composition from about 5 parts to about 100 parts of the carbon fiber-carbon black combination is employed.

In the case where carbon fibers alone are employed the amount may range from about 5 parts to about 100 parts by weight for every 100 parts by weight of the polyphenylene ether-styrene resin composition.

The aluminum flakes which have been found highly effective have an approximate size of 0.040"×0.050"×0.001". They are manufactured by Scientific Advances, Inc. and sold under the trademark "Transmet" flakes.

The carbon fibers employed were those sold under the trademark "Thornel UME" fibers obtainable from the Union Carbide Co.

The carbon black employed is a highly conductive, non-reinforcing furnace type carbon black having a particle size of 30 millimicrons and apparent bulk density of 150 grams per liter. It is manufactured by Armak Co. and sold under the name "Ketjen black EC".

Various methods may be used for compounding the components to form the EMI shielding composites. They can be prepared by milling on a rubber mill followed by compression molding. This process has the advantage of low shear conditions so that the aluminum flakes and fibers are not distorted and the fibers shortened.

In an alternative procedure the compounding is carried out in a Brabender extruder equipped with a 1:1 ratio screw and molded into standard 6"×8"×0.1" plates for testing in an injection molding machine, such as a 250 ton Cincinnati injection molding machine. A 4 oz. Newbury injection molding machine was used for making smaller standard test samples.

Compounding temperatures can range from about 500° F. to about 650° F.; and molding temperatures from about 500° F. to about 650° F.

The conductive filler should be uniformly distributed throughout the molded part, so as to avoid any conductive particle deficient areas which would provide a "transparent window" for the electromagnetic radiation.

A common method of measuring the effectiveness of a shielding system is to establish the level of attenuation in decibels (dB) needed to provide protection to the system. Attenuation is a function of the electrical conductivity of the shield. The decibel unit is a logarithric measure of the degree of shielding. A 10 decibel reading indicates that 90% of the EMI (or RHI) energy is effectively dissipated. Twenty decibels means that 99% of the EMI (or RHI) is dissipated, and so on. The shielding effectiveness is measured against various radio frequencies (in MHz).

DESCRIPTION OF THE PREFERRED EMBODIMENTS

The following Examples are set forth as further illustrations of the invention and are not to be considered as limiting the invention thereto. The parts are by weight.

EXAMPLE I

There were made up composites, of poly-(2,6-dimethyl-1,4-phenylene)ether (PPO) and polystyrene (PS) in a ratio 1:1 PPO:PS in which were incorporated aluminum flakes having an approximate size of 0.040"×0.050"×0.001" in the percentage amounts indicated in Table 1 and IA below. The range is from 0% to 70%. The composites were prepared on a rubber mill followed by compression molding. Table I shows the physical properties of the composites while Table 1A shows the shielding effectiveness. The Table 1 and IA clearly show that composites can be made with aluminum flakes which have good strength and toughness as well as the desired shielding effectiveness.

injection molding machine. The flakes were of the same type as indicated in Example I.

Again, this Example demonstrates that composites of PPO with HIPS (high impact polystyrene) having incorporated therein aluminum flakes have good strength and toughness as well as shielding effectiveness.

TABLE 2

PHYSICAL PROPERTIES OF INJECTION MOLDED PPO:HIPS - ALUMINUM FLAKE COMPOSITES

| Percent Aluminum Flakes | Tensile Strength (psi) | Tensile Elongation (%) | Flexural Strength (psi) | Flexural Modulus (psi) | Notched Izod Impact Str. (ft.lb./in.n) | HDT (°F.) |
|---|---|---|---|---|---|---|
| 30 | 6600 | 6.2 | 10,900 | 712,000 | 2.5 | 197 |
| 35 | 6500 | 7.6 | 8,800 | 697,000 | 1.8 | 197 |
| 40 | 6000 | 5.2 | 9,700 | 777,000 | 2.2 | 197 |

TABLE I

PHYSICAL PROPERTIES OF COMPRESSION MOLDED PPO—PS ALUMINUM FLAKE COMPOSITES

| Percent Aluminum Flakes | Tensile Strength (psi) | Tensile Elongation (%) | Flexural Strength (psi) | Flexural Modulus (psi) | Notched Izod Impact Strength ft.lb./in.n. | HDT °F. |
|---|---|---|---|---|---|---|
| 0 | 6300 | 14.9 | 11,600 | 323,000 | 2.5 | 254–259 |
| 10 | 5800 | 16.1 | 12,400 | 415,000 | 2.3 | 261–260 |
| 20 | 5700 | 7.9 | 12,500 | 499,000 | 2.1 | 265–270 |
| 30 | 4500 | 5.2 | 9,600 | 590,000 | 2.1 | 260–268 |
| 40 | 4500 | 4.7 | 11,300 | 790,000 | 2.2 | 268–275 |
| 50 | 4500 | 4.4 | 10,200 | 969,000 | 2.0 | 276–283 |
| 60 | 5100 | 3.6 | 11,300 | 1,411,000 | 2.7 | 270–274 |
| 70 | 4600 | 4.8 | 10,100 | 1,923,000 | — | 320–324 |

TABLE 1A

SHIELDING EFFECTIVENESS (dB) VS FREQUENCY (MHZ) OF COMPRESSION MOLDED PPO—PS ALUMINUM FLAKE COMPOSITES

| Percent Aluminum Flakes | FREQUENCY (in MHz) | | | | | | | |
|---|---|---|---|---|---|---|---|---|
| | 0.5 | 1.5 | 5.0 | 15.0 | 50.0 | 250.0 | 500.0 | 960.0 |
| 20 | 0 | 0 | 0 | 0 | 0 | 1 | 1 | 1 |
| 30 | 10 | 10 | 10 | 10 | 1 | 10 | 11 | 12 |
| 40 | 23 | 23 | 23 | 21 | 2 | 22 | 24 | 22 |
| 50 | 39 | 39 | 39 | 38 | 3 | 36 | 38 | 40 |
| 60 | 55 | 55 | 55 | 54 | 5 | 48 | 43 | 37 |
| 70 | 61 | 62 | 62 | 61 | 6 | 65 | 65 | 63 |

TABLE 2A

SHIELDING EFFECTIVENESS (dB) vs. FREQUENCY (MHz) OF INJECTION MOLDED PPO:HIPS - ALUMINUM FLAKE COMPOSITES

| Percent Aluminum Flakes | Frequency (in MHz) | | | | | | | |
|---|---|---|---|---|---|---|---|---|
| | 0.5 | 1.5 | 5.0 | 15.0 | 50.0 | 250.0 | 500.0 | 960.0 |
| 30 | 11 | 11 | 11 | 14 | 5 | 12 | 14 | 10 |
| 35 | 36 | 36 | 36 | 36 | 33 | 21 | 10 | 18 |
| 40 | 43 | 43 | 43 | 43 | 40 | 23 | 34 | 33 |

EXAMPLE II

Composites where made of 40 parts by weight of PPO, 60 parts by weight of high impact polystyrene (HIPS) (available as Amoco 6H6, from Amoco Chemicals Corp.), and 13 parts by weight of triphenyl phosphate in which were incorporated the percentage amounts of aluminum flakes indicated in Tables 2 and 2A. The composites were compounded using a Brabender extruder equipped with a 1:1 ratio screw and molded into 6"×8"×0.1" plaques using a Cincinnati

EXAMPLE III

The composites were prepared in the same manner as in Example II except that carbon fibers were employed as the electric conductive material instead of the aluminum flakes. The fibers had diameters of 100 microns and weighed 600 gms/liter. Such fibers are available under tradename THORNEL VME carbon fibers from the Union Carbide Co.

The proportion of PPO:HIPS and triphenyl phosphate are the same as in Example II and the various percentages of the carbon fibers employed and the results obtained are set forth in Tables 3 and 3A which follow.

TABLE 3

PHYSICAL PROPERTIES OF INJECTION MOLDED PPO:HIPS - CARBON FIBER COMPOSITES

| Percent Carbon fiber | Tensile Strength (psi) | Tensile Elongation (%) | Flexural Strength (psi) | Flexural Modulus (psi) | Notched Izod Impact Str. (ft.lb./in.n) | HDT (°F.) |
|---|---|---|---|---|---|---|
| 30 | 9500 | 6.2 | 16,300 | 1,177,000 | 1.3 | 198 |
| 35 | 9500 | 6.4 | 17,000 | 1,344,000 | 1.3 | 200–205 |
| 40 | 11,800 | 7.4 | 17,900 | 1,374,000 | 1.1 | 204 |

TABLE 3A

SHIELDING EFFECTIVENESS (dB) vs. FREQUENCY (MHz) OF INJECTION MOLDED PPO:HIPS - CARBON FIBER COMPOSITES

| Percent Carbon Fiber | Frequency (in MHz) | | | | | | | |
|---|---|---|---|---|---|---|---|---|
| | 0.5 | 1.5 | 5.0 | 15.0 | 50.0 | 250.0 | 500.0 | 960.0 |
| 30 | 2 | 3 | 3 | 3 | 4 | 7 | 9 | 10 |
| 35 | 11 | 12 | 12 | 12 | 12 | 14 | 14 | 14 |
| 40 | 23 | 23 | 23 | 24 | 24 | 23 | 24 | 22 |

EXAMPLES IV, V, AND VI

The composites were prepared in the same manner as described in Example II except that the electric conductive material (filler) employed and the percentages thereof are that which is set forth in Tables 4 and 4A which constitute Example IV; 5 and 5A which constitute Example V, and 6 and 6A which constitute Example VI. The aluminum flakes are the same type as employed in Examples I and II and the carbon fiber is the same type as that employed in Example III. The carbon black is a highly conductive, non-reinforcing furnace type carbon black, having a particle size of 30 millimicrons and an apparent bulk density of 150 g/l manufactured by Armak Co. and available under the trademark "KETJEN black EC".

The tables show the EMI shielding properties of the polyphenylene ether-styrene resin composites containing combinations of aluminum flakes and carbon fibers (Tables 4 and 4A); of aluminum flakes and conductive carbon black (Tables 5 and 5A); and of carbon fiber and carbon black (Tables 6 and 6A).

Again, these Examples demonstrate that composites of polyphenylene ether-styrene resin composites having incorporated the conductive materials indicated have good strength and toughness as well as shielding effectiveness.

TABLE 4

PHYSICAL PROPERTIES OF INJECTION MOLDED PPO-HIPS - ALUMINUM FLAKE-CARBON FIBER COMPOSITES

| Filler & Percent | Tensile Strength (psi) | Tensile Elongation % | Flexural Strength (psi) | Flexural Modulus (psi) | Notched Izod Impact Str. (ft.lb./in.n.) | HDT (°F.) |
|---|---|---|---|---|---|---|
| Al. Flakes-35 | 6,500 | 7.6 | 8,800 | 697,000 | 1.8 | 191 |
| Al. Flakes-30 Carbon Fbr.-5 | 7,400 | 6.9 | 11,900 | 660,000 | 1.8 | 195 |
| Al. Flakes-25 Carbon Fbr.-10 | 7,400 | 6.2 | 12,300 | 783,000 | 1.6 | 195 |

TALBE 4A

SHIELDING EFFECTIVENESS (dB) Vs. FREQUENCY (MHz) OF INJECTION MOLDED PPO-HIPS - ALUMINUM FLAKE-CARBON FIBER COMPOSITES

| Filler & Percent | Frequency (in MHz) | | | | | | | |
|---|---|---|---|---|---|---|---|---|
| | 0.5 | 1.5 | 5.0 | 15.0 | 50.0 | 250.0 | 500.0 | 960.0 |
| Al. Flakes-35 | 36 | 36 | 36 | 36 | 33 | 21 | 10 | 18 |
| Al. Flakes-30 Carbon Fbr.-5 | 33 | 34 | 34 | 33 | 30 | 26 | 23 | 24 |
| Al. Flakes-25 Carbon Fbr.-10 | 21 | 22 | 22 | 22 | 21 | 17 | 21 | 19 |

TABLE 5

PHYSICAL PROPERTIES OF INJECTION MOLDED PPO-HIPS - ALUMINUM FLAKE-CARBON BLACK COMPOSITES

| Filler & Percent | Tensile Strength (psi) | Tensile Elongation % | Flexural Strength (psi) | Flexural Modulus (psi) | Notched Izod Impact Str. (ft.lb./in.n.) | HDT (°F.) |
|---|---|---|---|---|---|---|
| Al.Flakes-35 | 6,500 | 7.6 | 8,000 | 697,000 | 1.8 | 191 |
| Al.Flakes-32 Carbon Blk-3 | 4,700 | 4.3 | 9,900 | 646,000 | 1.0 | 199 |
| Al.Flakes-30 Carbon Blk-5 | 4,800 | 4.3 | 9,200 | 683,000 | 0.9 | 198 |

TABLE 5A

SHIELDING EFFECTIVENESS (dB) Vs. FREQUENCY (MHz) OF INJECTION MOLDED PPO-HIPS ALUMINUM FLAKE-CARBON BLACK COMPOSITES

| Filler & Percent | Frequency (in MHz) | | | | | | | |
|---|---|---|---|---|---|---|---|---|
| | 0.5 | 1.5 | 5.0 | 15.0 | 50.0 | 50.0 | 500.0 | 960.0 |
| Al.Flakes-35 | 36 | 36 | 36 | 36 | 33 | 21 | 10 | 18 |
| Al.Flakes-32 Carbon Blk-3 | 34 | 34 | 34 | 32 | 30 | 26 | 22 | 22 |
| Al.Flakes-30 Carbon Blk.-5 | 30 | 31 | 31 | 30 | 30 | 26 | 16 | 21 |

TABLE 6

PHYSICAL PROPRERTIES OF INJECTION MOLDED PPO-HIPS - CARBON FIBER-CARBIN BLACK COMPOSITES

| Filler & Percent | Tensile Strength (psi) | Tensile Elongation % | Flexural Strength (psi) | Flexural Modulus (psi) | Notched Izod Impact. Str. ft.lb./in.n. | HDT (°F.) |
|---|---|---|---|---|---|---|
| Carbon Fbr.-35 | 9,500 | 6.4 | 17,000 | 1,344,000 | 1.3 | 202 |
| Carbon Fbr.-32 Carbon Blk-3 | 8,600 | 5.2 | 16,500 | 1,085,000 | 0.9 | 206 |
| Carbon Fbr.-30 Carbon Blk-5 | 8,800 | 6.0 | 14,200 | 1,004,000 | 0.8 | 205 |

TABLE 6A

SHIELDING EFFECTIVENESS (dB) Vs. FREQUENCY (MHz) OF INJECTION MOLDED PPO-HIPS-CARBON FIBER-CARBON BLACK COMPOSITES

| Filler & Perrcent | Frequency (in MHz) | | | | | | | |
|---|---|---|---|---|---|---|---|---|
| | 0.5 | 1.5 | 5.0 | 15.0 | 50. | 250.0 | 500.0 | 960.0 |
| Carbon Fbr.-35 | 11 | 12 | 12 | 12 | 1 | 14 | 14 | 14 |
| Carbon Fbr.-32 Carbon Blk-3 | 8 | 8 | 8 | 7 | 8 | 13 | 15 | 16 |
| Carbon Fbr.-30 Carbon Blk.-5 | 8 | 8 | 8 | 8 | 9 | 14 | 16 | 17 |

The novel compositions or composites of this invention can be molded into electronic equipment components or housings requiring EMI shielding, and such structures or articles are included within the scope of this invention. Examples, but not limited thereto, are panel boards for printed circuits, radio and television panels and housings, and housings for computers and large calculators, audio and high fidelity equipment, sensitive test instruments and the like.

The above mentioned patents and/or patent applications are incorporated herein by reference. Obviously other modifications and variations of the invention are possible in light of the above teachings. It is, therefore, to be understood that changes may be made in the particular embodiments of the invention which are within the full intended scope of the invention as defined by the appended claims.

We claim:

1. A thermoplastic molding composition which comprises:
   (a) a polyphenylene ether-styrene resin composition; and
   (b) a conductive material selected from the group consisting of aluminum flakes, a combination of aluminum flakes with carbon fibers or conductive carbon black, a combination of carbon fibers and conductive carbon black, and carbon fibers, in an amount sufficient to render the composition when molded shielding against electromagnetic interference.

2. A composition as defined in claim 1 wherein the conductive material is aluminum flakes.

3. A composition as defined in claim 1 wherein the aluminum flakes have an approximate size of 0.040"×0.050"×0.001".

4. A composition as defined in claim 1 wherein the conductive material is a combination of aluminum flakes with carbon fibers.

5. A composition as defined in claim 1 wherein the conductive material is a combination of aluminum flakes and conductive carbon black.

6. A composition as defined in claim 1 wherein the conductive material is a combination of carbon fibers and conductive carbon black.

7. A composition as defined in claim 1 wherein the conductive material is carbon fibers.

8. A composition as defined in claim 1 wherein the polyphenylene ether resin includes structural units of the formula:

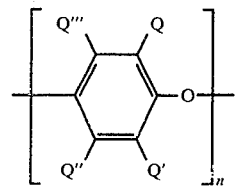

wherein Q, Q', Q" and Q'" are independently selected from the group consisting of hydrogen, hydrocarbon radicals, halohydrocarbon radicals having at least two carbon atoms between the halogen atom and the phenyl nucleus, hydrocarbonoxy radicals and halohydrocarbonoxy having at least two carbon atoms between the halogen atom and the phenyl nucleus, and Q', Q" and Q'" in addition may be halogen with the proviso that Q and Q' are both free of a tertiary carbon atom; and n represents the total number of monomer residues and is an integer of at least 50.

9. A composition as defined in claim 8 wherein the polyphenylene ether resin is poly(2,6-dimethyl-1,4-phenylene)ether.

10. A composition as defined in claim 1 where the styrene resin is a polystyrene.

11. A composition as defined in claim 1 wherein the styrene resin is a high impact polystyrene.

12. A composition as defined in claim 1 wherein the polyphenylene ether resin is poly(2,6-dimethyl-1,4-phenylene)ether, the styrene resin is a polystyrene and the conductive material is aluminum flakes.

13. A composition as defined in claim 12 wherein the aluminum flakes have an approximate size of 0.040"×0.050"×0.001".

14. A composition as defined in claim 1 wherein the polyphenylene ether resin is poly(2,6-dimethyl-1,4-phenylene)ether, the styrene resin is a polystyrene, and the conductive material is a combination of aluminum flakes with carbon fibers.

15. A composition as defined in claim 1 wherein the polyphenylene ether resin is poly(2,6-dimethyl-1,4-phenylene)ether, the styrene resin is a polystyrene, and the conductive material is a combination of aluminum flakes with conductive carbon black.

16. The compositions as defined in claims 12, 13, 14 or 15 wherein the styrene resin is a high impact polystyrene resin.

17. The composition as defined in claim 1 which comprises 100 parts by weight of the polyphenylene ether-styrene resin composition and from about 5 parts to about 250 parts by weight of the conductive material.

18. A molded composition obtained by injection or compression molding the composition of claim 1.

19. An electronic equipment component exhibiting electromagnetic shielding, manufactured from the composition described in claim 1.

20. A housing for electric/electronic equipment subject to electromagnetic interference, manufactured from the composition described in claim 1.

* * * * *